United States Patent
Lu et al.

(10) Patent No.: US 11,532,803 B2
(45) Date of Patent: Dec. 20, 2022

(54) DISPLAY PANEL AND METHOD OF MANUFACTURING THE SAME, AND DISPLAY DEVICE

(71) Applicant: BOE TECHNOLOGY GROUP CO., LTD., Beijing (CN)

(72) Inventors: Pengcheng Lu, Beijing (CN); Xiaochuan Chen, Beijing (CN); Shengji Yang, Beijing (CN); Kuanta Huang, Beijing (CN); Minghua Xuan, Beijing (CN); Lei Wang, Beijing (CN); Yanming Wang, Beijing (CN); Dongni Liu, Beijing (CN); Han Yue, Beijing (CN); Weihai Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 181 days.

(21) Appl. No.: 16/640,486

(22) PCT Filed: Jul. 24, 2019

(86) PCT No.: PCT/CN2019/097545
§ 371 (c)(1),
(2) Date: Feb. 20, 2020

(87) PCT Pub. No.: WO2020/020244
PCT Pub. Date: Jan. 30, 2020

(65) Prior Publication Data
US 2020/0176722 A1 Jun. 4, 2020

(30) Foreign Application Priority Data
Jul. 25, 2018 (CN) .......................... 201810828742.1

(51) Int. Cl.
*H01L 51/56* (2006.01)
*H01L 27/32* (2006.01)
(Continued)

(52) U.S. Cl.
CPC .......... *H01L 51/56* (2013.01); *H01L 27/3276* (2013.01); *H01L 51/0009* (2013.01);
(Continued)

(58) Field of Classification Search
CPC . H01L 51/56; H01L 27/3276; H01L 51/0009; H01L 51/0011; H01L 51/5212
(Continued)

(56) References Cited

U.S. PATENT DOCUMENTS

2003/0222576 A1\* 12/2003 Lu .................... H01L 27/322
  313/504
2009/0081356 A1\* 3/2009 Fedorovskaya ....... C23C 16/403
  427/66
(Continued)

FOREIGN PATENT DOCUMENTS

CN 1464766 A 12/2003
CN 104898887 A 9/2015
(Continued)

OTHER PUBLICATIONS

English Machine Translation of CN107123621 (Year: 2017).\*
(Continued)

*Primary Examiner* — Dzung Tran
(74) *Attorney, Agent, or Firm* — McDermott Will & Emery LLP

(57) ABSTRACT

A method of manufacturing a display panel includes providing a base substrate and forming a plurality of anodes above the base substrate; forming a photoresist layer above a side of the base substrate above which the plurality of anodes are formed, the photoresist layer including a plurality
(Continued)

of openings and each opening corresponding to at least one anode; and forming a plurality of light emitting layers and a cathode layer sequentially above a side of the base substrate above which the plurality of anodes and the photoresist layer are formed, the cathode layer including a plurality of cathode films and each cathode film corresponding to a single opening.

12 Claims, 15 Drawing Sheets

(51) Int. Cl.
*H01L 51/00* (2006.01)
*H01L 51/52* (2006.01)

(52) U.S. Cl.
CPC ...... *H01L 51/0011* (2013.01); *H01L 51/5212* (2013.01); *H01L 51/5228* (2013.01); *H01L 2227/323* (2013.01)

(58) Field of Classification Search
USPC .......................................................... 257/79
See application file for complete search history.

(56) References Cited

U.S. PATENT DOCUMENTS

| | | | | |
|---|---|---|---|---|
| 2013/0140597 | A1* | 6/2013 | Kim | H01L 51/0013 257/98 |
| 2014/0014924 | A1* | 1/2014 | Oh | H01L 51/56 257/40 |
| 2014/0110674 | A1* | 4/2014 | Choe | H01L 27/3279 257/40 |
| 2015/0243704 | A1* | 8/2015 | Lee | H01L 27/3279 257/79 |
| 2016/0104859 | A1* | 4/2016 | Kim | H01L 27/3246 257/40 |
| 2017/0147121 | A1 | 5/2017 | Yang et al. | |
| 2019/0326359 | A1 | 10/2019 | Yang et al. | |

FOREIGN PATENT DOCUMENTS

| | | |
|---|---|---|
| CN | 107123621 A | 9/2017 |
| CN | 107819016 A | 3/2018 |

OTHER PUBLICATIONS

Second Office Action issued in corresponding Chinese Application No. 201810828742.1, dated Aug. 13, 2020, with English language translation.

International Search Report and Written Opinion issued in corresponding International Application No. PCT/CN2019/097545, dated Oct. 30, 2019, with English language translation.

First Office Action issued in corresponding Chinese Application No. 201810828742.1, dated Mar. 3, 2020, with English language translation.

\* cited by examiner

DISPLAY PANEL AND METHOD OF MANUFACTURING THE SAME, AND DISPLAY DEVICE

CROSS-REFERENCE TO RELATED APPLICATIONS

This application is a national phase entry under 35 USC 371 of International Patent Application No. PCT/CN2019/097545 filed on Jul. 24, 2019, which claims priority to and benefit of Chinese Patent Application No. 201810828742.1, filed on Jul. 25, 2018, titled "DISPLAY PANEL AND METHOD OF MANUFACTURING THE SAME, DISPLAY DEVICE", which are incorporated herein by reference in their entirety.

TECHNICAL FIELD

The present disclosure relates to the field of display technologies, and in particular, to a display panel and a method of manufacturing the same, and a display device.

BACKGROUND

At present, with advancement of VR (Virtual Reality) and AR (Augmented Reality) technologies and rapid growth of a market thereof, display panels suitable for VR and AR fields are rapidly developing towards miniaturization, high PPI (Pixels Per Inch), quick response, and wide color gamut. Silicon-based display panels, especially silicon-based micro OLED (Organic Light Emitting Diode) display panels, are a prominent development direction.

SUMMARY

In one aspect, a method of manufacturing a display panel is provided. The method of manufacturing a display panel includes: providing a base substrate and forming a plurality of anodes above the base substrate; forming a photoresist layer above a side of the base substrate above which the plurality of anodes are formed, the photoresist layer including a plurality of openings and each opening corresponding to at least one anode; and forming a plurality of light emitting layers and a cathode layer sequentially above a side of the base substrate above which the plurality of anodes and the photoresist layer are formed, the cathode layer including a plurality of cathode films and each cathode film corresponding to a single opening.

In some embodiments, a thickness of the photoresist layer is greater than a sum of a thickness of each anode and a thickness of a light emitting layer corresponding to the anode.

In some embodiments, each opening is configured to correspond to a single anode.

In some embodiments, each opening is configured to correspond to at least two anodes.

In some embodiments, in each opening, each anode is configured to correspond to a single light emitting layer. During a process of forming the plurality of light emitting layers, in each opening, an area of a light emitting layer is set to be greater than an area of an anode corresponding to the light emitting layer, so that a light emitting material of the light emitting layer fills at least one gap between the anode and at least one anode adjacent thereto.

In some embodiments, forming the plurality of light emitting layers, includes: using light emitting materials configured to emit light of different colors to form light emitting layers configured to emit light of corresponding colors sequentially; and during a process of forming light emitting layers configured to emit light of each color, in each opening, an area of each light emitting layer is set to be greater than an area of an anode corresponding to the light emitting layer, so that the light emitting material of the light emitting layer fills at least one gap between the at least two anodes corresponding to the opening.

In some embodiments, an orthographic projection of each opening on the base substrate is in a shape of a strip or a block.

In some embodiments, after forming the plurality of light emitting layers and the cathode layer sequentially, the method of manufacturing a display panel further includes: removing part of the cathode layer other than the plurality of cathode films and the photoresist layer.

In some embodiments, a laser ablation process is adopted in removing the part of the cathode layer other than the plurality of cathode films and the photoresist layer.

In some embodiments, after removing the part of the cathode layer other than the plurality of cathode films and the photoresist layer, the method of manufacturing a display panel further includes: forming a first insulating layer above a side of the base substrate above which the plurality of cathode films are formed; and providing a cover plate on a side of the first insulating layer facing away from the base substrate.

In some embodiments, the photoresist layer further includes a plurality of hollow patterns. During a process of forming the cathode layer, a cathode layer material is deposited into the plurality of hollow patterns to form a plurality of cathode voltage signal lines corresponding to the plurality of hollow patterns; and each cathode voltage signal line is electrically connected to at least one cathode film.

In another aspect, a display panel is provided. The display panel includes: a base substrate; a plurality of anodes disposed above the base substrate; a plurality of light emitting layers disposed on a side of the plurality of anodes facing away from the base substrate, each light emitting layer corresponding to a single anode; and a plurality of cathode films disposed on a side of the plurality of light emitting layers facing away from the base substrate, the plurality of cathode films being insulated from each other, and each cathode film corresponding to at least one light emitting layer.

In some embodiments, each cathode film corresponds to a single light emitting layer and a single anode.

In some embodiments, each cathode film corresponds to at least two light emitting layers and at least two anodes.

In some embodiments, at least one gap between the at least two anodes corresponding to each cathode film is filled with at least one light emitting material of at least one of the at least two light emitting layers corresponding to the at least two anodes.

In some embodiments, each cathode film is in a shape of a strip or a block.

In some embodiments, the display panel further includes a plurality of sub-pixels arranged in multiple rows or multiple columns. In a case where each cathode film is in the shape of a strip, an orthographic projection of each cathode film on the base substrate covers orthographic projections of light emitting layers and anodes corresponding to a plurality of sub-pixels arranged consecutively in a single row or a single column of sub-pixels on the base substrate. In a case where each cathode film is in the shape of a block, a display area of the display panel is divided into multiple polygonal regions, each polygonal region being provided with a plurality of sub-pixels; and an orthographic projection of each cathode film on the base substrate covers orthographic projections of light emitting layers and anodes corresponding to a plurality of sub-pixels in a single polygonal region on the base substrate.

In some embodiments, the display panel further includes a plurality of sub-pixels. The at least two light emitting layers and the at least two anodes corresponding to each cathode film are in a same pixel.

In some embodiments, the display panel further includes a plurality of cathode voltage signal lines that are disposed in a same layer as the plurality of cathode films. Each cathode voltage signal line is electrically connected to at least one cathode film.

In some embodiments, each cathode voltage signal line is electrically connected to a single cathode film. Or, the plurality of cathode films are arranged in multiples rows or multiple columns, and each cathode voltage signal line is electrically connected to a plurality of cathode films in a single row or a single column.

In yet another aspect, a display device is provided. The display device includes the display panel described above.

BRIEF DESCRIPTION OF THE DRAWINGS

In order to describe technical solutions in embodiments of the present disclosure or in the related art more clearly, the accompanying drawings to be used in the description of some embodiments of the present disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art shall be included in the protection scope of the present disclosure.

A silicon-based micro OLED (Organic Light Emitting Diode) display panel has a high PPI (Pixels Per Inch). A size of each sub-pixel therein is very small, and a light emitting layer of each light emitting device in each sub-pixel is very thin. Consequently, a short circuit may easily occur between an anode and a cathode of the light emitting device due to a small thickness of the light emitting layer. Once a short circuit occurs, a cathode voltage VSS of the light emitting device will change. In the related art, a cathode layer in the silicon-based micro OLED display panel is a one-piece structure. That is to say, cathode voltages VSS of all light emitting devices are the same. Therefore, once a short circuit occurs in a certain sub-pixel, normal display of all other sub-pixels will be affected due to a change in the cathode voltage VSS. That is, a display effect will be affected.

Some embodiments of the present disclosure provide a method of manufacturing a display panel. As shown in FIGS. 1D, 1F, 1G, and 1H, the method includes step 10 (S10) to step 30 (S30).

Figure 10:
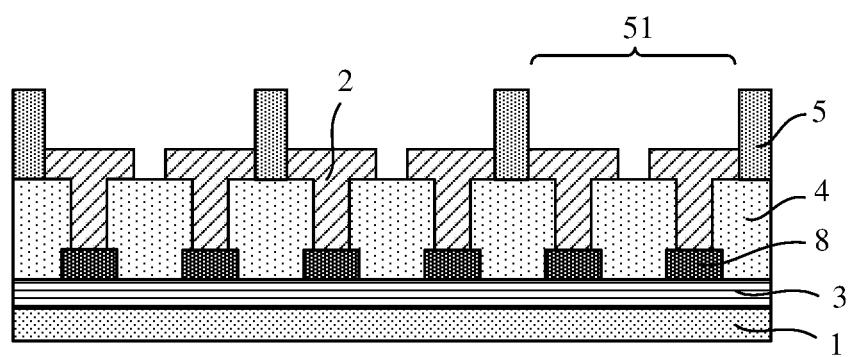
FIG. 10 is a schematic diagram showing one step of a method of manufacturing a display panel according to some embodiments of the present disclosure.

In S10, as shown in FIG. 10, a base substrate 1 is provided, and a plurality of anodes 2 are formed above the base substrate 1.

Figure 1A:
FIGS. 1A-1K are diagrams showing steps of a method of manufacturing a display panel according to some embodiments of the present disclosure.
Figure 1B:
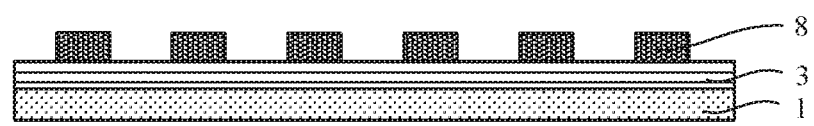
Figure 1C:
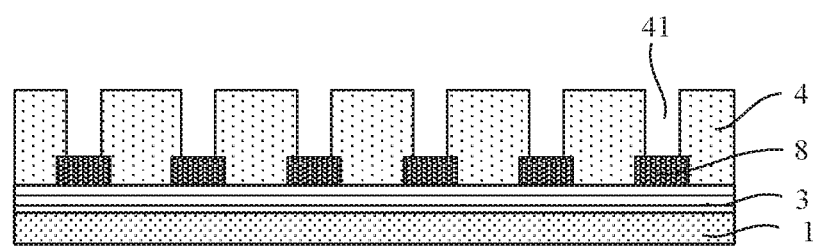
Figure 1D:
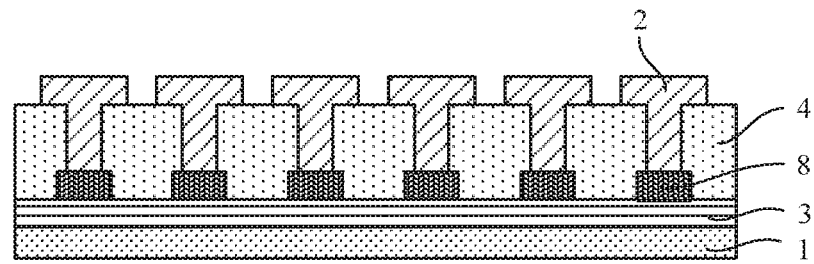
Figure 1E:
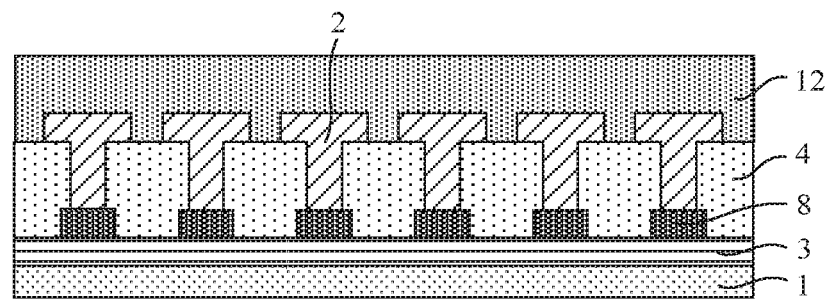
Figure 1F:
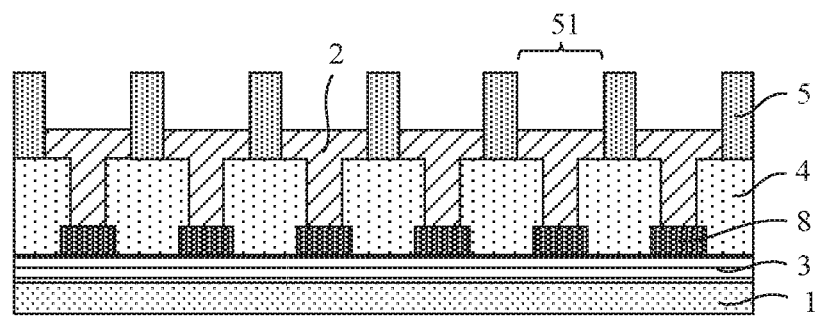
Figure 5:
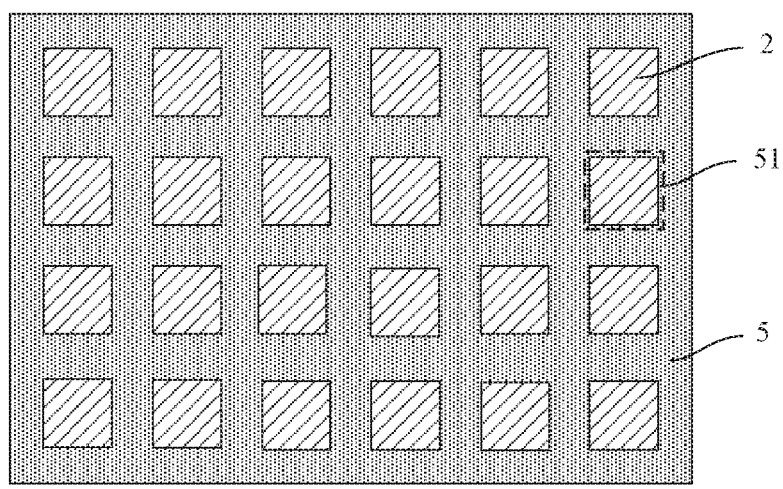
FIG. 5 is a plan view showing a structure of a photoresist layer according to some embodiments of the present disclosure.

In S20, as shown in FIG. 1F, a photoresist layer 5 is formed above a side of the base substrate 1 above which the plurality of anodes 2 are provided. The photoresist layer 5 has a plurality of openings 51 (as shown in FIG. 5), and each opening 51 corresponds to at least one anode 2.

Figure 1G:
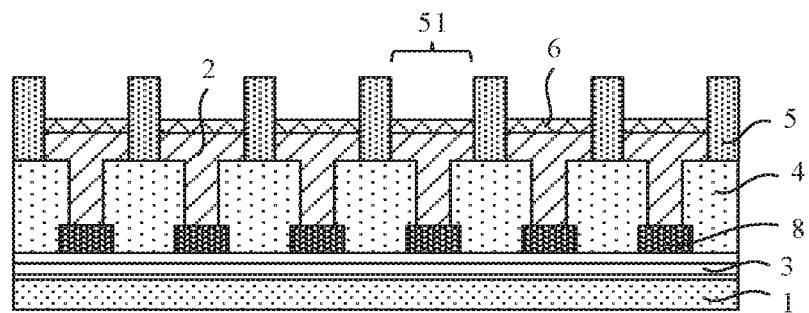
Figure 1H:
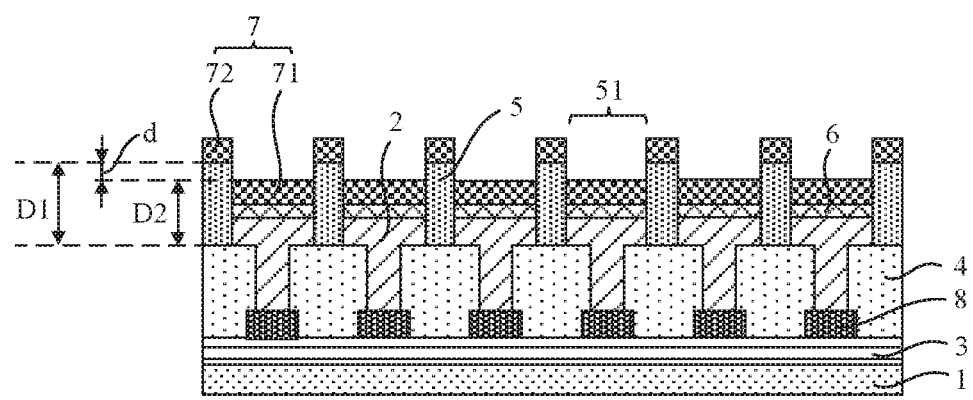

In S30, as shown in FIGS. 1G and 1H, light emitting layers 6 and a cathode layer 7 are formed above a side of the base substrate 1 above which the plurality of anodes 2 and the photoresist layer 5 are provided. The cathode layer 7 includes a plurality of cathode films 71, and each cathode film 71 corresponds to a single opening 51.

In this way, in a process of forming the cathode layer 7, the cathode layer 7 is formed above the side of the base substrate 1 above which the plurality of anodes 2 and the photoresist layer 5 are provided. Thus, during a process of depositing a cathode layer material to form the cathode layer 7, a part of the cathode layer material will fall into the plurality of openings 51 in the photoresist layer 5, and a part of the cathode layer material will fall onto a surface of the photoresist layer 5 facing away from the base substrate 1. Therefore, the cathode layer 7 will be divided into a part corresponding to the plurality of openings 51 and a part located on the photoresist layer 5. As a result, division of the cathode layer 7 is achieved by use of the photoresist layer 5, and a plurality of independent cathode films 71 are obtained.

Herein, each opening 51 corresponds to at least one sub-pixel. That is, each cathode film 71 corresponds to at least one sub-pixel. In this way, in a case where a short circuit occurs in a certain sub-pixel, only one or more sub-pixels corresponding to a same opening 51 as the short-circuited sub-pixel will be affected through the cathode voltage VSS of the cathode film 71, and sub-pixels corresponding to other openings 51 will not be affected. Therefore, an influence range of the short-circuited sub-pixel may be reduced, and partition control of sub-pixels in a display panel may be realized. In particular, in a case where each opening 51 corresponds to a single sub-pixel, a short circuit in the sub-pixel may not affect other sub-pixels in the display panel, thereby ensuring a display effect and reliability of the display panel.

It will be noted that, PS (Post Spacer) barriers may be formed on a glass substrate of a glass-based display panel (that is, a display panel in which a base substrate of an array substrate is a glass substrate) to achieve division of the cathode layer and thus realize independent control of the sub-pixels. However, the PS barrier walls will increase a thickness of the entire display panel, which is contrary to the current thin design trend of display panels. In the method of manufacturing a display panel provided in the embodiments of the present disclosure, the photoresist layer 5 may be removed in a subsequent process, and may not cause an increase in the thickness of the display panel.

In addition, in a display panel manufactured by the method of manufacturing a display panel provided in the embodiments of the present disclosure, partition adjustment of brightness may be realized in a display area of the display panel.

Figure 2:
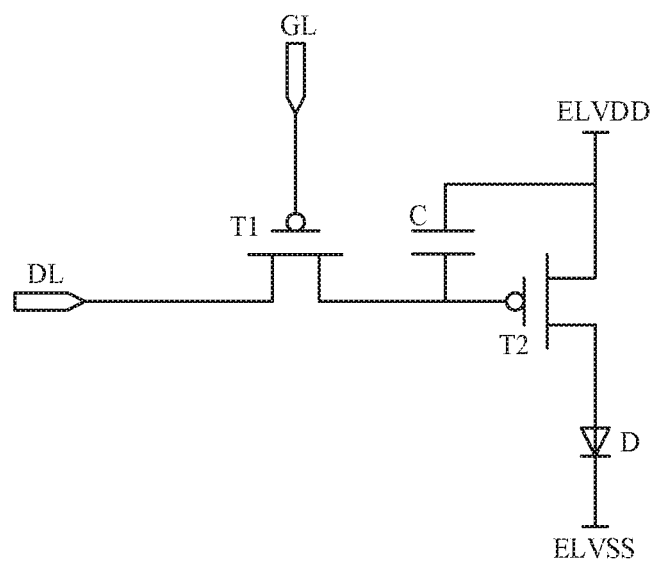
FIG. 2 is a diagram showing a structure of a pixel circuit according to some embodiments of the present disclosure.

As shown in FIG. 2, with a 2T1C OLED pixel circuit as an example, the pixel circuit includes two thin film transistors T1 and T2, and a storage capacitor C. The thin film transistor T2 is a driving transistor. A voltage difference between two ends of a light emitting device D is determined by a cathode voltage VSS provided by a cathode voltage terminal ELVSS and an anode voltage VDD provided by an anode voltage terminal ELVDD. The anode voltage VDD is determined by a data signal voltage $V_{data}$ transmitted from a data signal terminal DL, a gate signal voltage $V_{gate}$ transmitted from a gate signal terminal GL, and a threshold voltage $V_{th}$ of a thin film transistor T2. In a case where the data signal voltage $V_{data}$, the gate signal voltage $V_{gate}$ and the threshold voltage $V_{th}$ of the thin film transistor T2 of the pixel circuit are respectively constant, the anode voltage VDD is also constant. Therefore, the cathode voltage VSS needs to be adjusted to adjust the voltage difference between two ends of the light emitting device D, so as to achieve brightness adjustment of the light emitting device D.

However, since the cathode layer provided in the related art is a one-piece structure, the cathode voltages VSS of all sub-pixels in the display area are the same, making it impossible to realize partition adjustment of brightness in the display area.

In the display panel manufactured by the method of manufacturing a display panel provided in the embodiments of the present disclosure, since the cathode layer 7 is divided into the plurality of independent cathode films 71 and each opening 51 corresponds to a single cathode film 71, it may be possible to adjust brightness of at least one sub-pixel corresponding to each opening 51 by adjusting a cathode voltage VSS of a cathode film 71 corresponding to the opening 51. In this way, the partition adjustment of brightness in the display area may be achieved.

In addition, compared with a solution in which the cathode layer is a one-piece structure, in the embodiments of the present disclosure, an adjustment range of a cathode voltage VSS of a cathode film 71 corresponding to each opening 51 is increased. Therefore, an adjustment range of the brightness of the at least one sub-pixel corresponding to each opening 51 may be increased, and the display effect may be improved.

In some embodiments, referring to FIG. 1H, a thickness of the photoresist layer 5 is greater than a sum of a thickness of each anode 2 and a thickness of a light emitting layer 6 corresponding to the anode 2. In this way, at positions of inner walls of each opening 51 formed by the photoresist layer 5, a surface of the photoresist layer 5 facing away from the base substrate 1 and a surface of a corresponding light emitting layer 6 facing away from the base substrate 1 together form a stepped structure. In a subsequent process of forming the cathode layer 7, due to existence of the stepped structure and a small thickness of the cathode layer 7, the cathode layer 7 will break at the positions of the inner walls of each opening 51 formed by the photoresist layer 5. Therefore, the cathode layer 7 will be divided to form the plurality of cathode films 71 remaining inside the plurality of openings 51 of the photoresist layer 5.

Based on this, referring to FIG. 1H, a thickness D1 of the photoresist layer 5 is set to be greater than or equal to a sum D2 of the thickness of each anode 2, the thickness of the light emitting layer 6 corresponding to the anode 2, and a thickness of the cathode layer 7. In this way, it may be possible to more effectively ensure that the photoresist layer 5 divides the cathode layer 7 to form a plurality of independent cathode films 71.

For example, with continued reference to FIG. 1H, the thickness D1 of the photoresist layer 5 is set to be greater than the sum D2 of the thickness of the anode 2, the thickness of the light emitting layer 6 corresponding to the anode 2, and the thickness of the cathode layer 7 by a predetermined size d. It will be noted that, the predetermined size d refers to a size capable of ensuring that the cathode layer 7 is effectively broken at the positions of the inner walls of each opening 51 formed by the photoresist layer 5. In this way, the part of the cathode layer 7 that falls into the openings 51 form the cathode films 71, and the part of the cathode layer 7 that falls onto the surface of the photoresist layer 5 facing away from the base substrate 1 form part 72 of the cathode layer 7 other than the plurality of cathode films. Moreover, the plurality of cathode films 71 are insulated from each other, which ensures that the photoresist layer 5 effectively divides the cathode layer 7.

In some possible designs, a value of the predetermined size d has a positive correlation with a thickness of the cathode layer 7. That is, the thicker the cathode layer 7 is, the larger the value of the predetermined size d needs to be set. Only in this way, it may be ensured that the cathode layer 7 is effectively broken at the positions of the inner walls of each opening 51 formed by the photoresist layer 5. The thinner the cathode layer 7 is, the smaller the value of the preset dimension d needs to be set. In this way, on a premise that the cathode layer 7 is effectively broken at the positions of the inner walls of each opening 51 formed by the photoresist layer 5, an amount of a photoresist layer material may be saved, and a difficulty of exposing a photoresist layer material may be reduced.

Figure 1I:
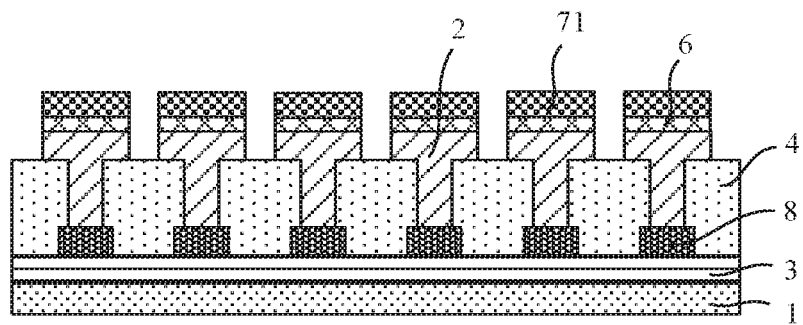
Figure 1J:
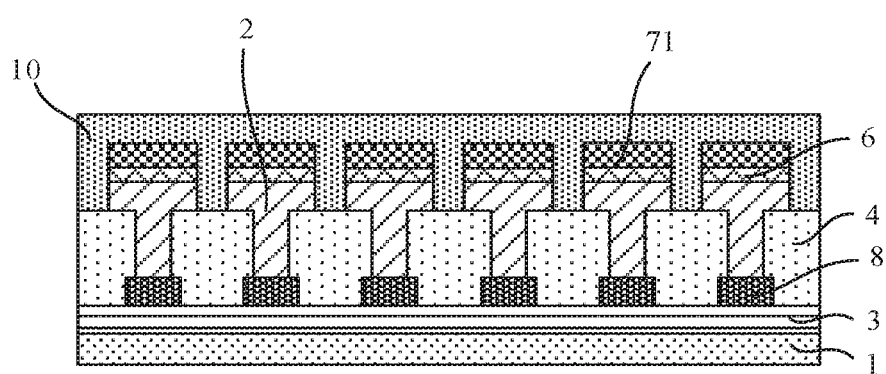
Figure 1K:
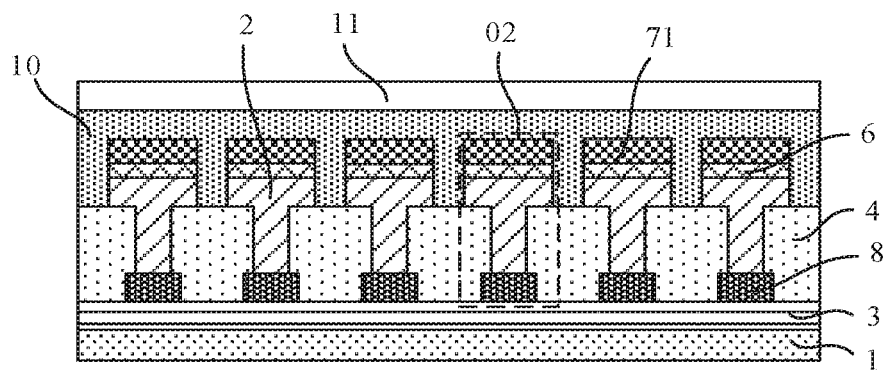

In some embodiments of the present disclosure, as shown in FIGS. 1I, 1J and 1K, after the process of forming the cathode layer 7 in S30, the method of manufacturing a display panel further includes step 40 (S40) to step 60 (S60).

In S40, as shown in FIG. 1I, the part 72 of the cathode layer other than the plurality of cathode films and the photoresist layer 5 are removed.

In S50, as shown in FIG. 1J, a first insulating layer 10 is formed above a side of the base substrate 1 above which the plurality of cathode films 71 are provided.

In S60, as shown in FIG. 1K, a cover plate 11 is provided on a side of the first insulating layer 10 facing away from the base substrate 1.

Each step (S10 to S60) of the method of manufacturing a display panel and other steps included in the method are described below with reference to FIGS. 1A to 1K.

S10 includes step 101 (S101) and step 102 (S102).

In S101, a base substrate 1 is provided.

The base substrate 1 provided in S101 includes a base material. The base material of the base substrate 1 is not limited herein. For example, the base material of the base substrate 1 may be a glass substrate, a silicon substrate, or the like. In some embodiments, the base substrate 1 further includes some film layers or electronic devices that are formed on the base material.

Figure 3:
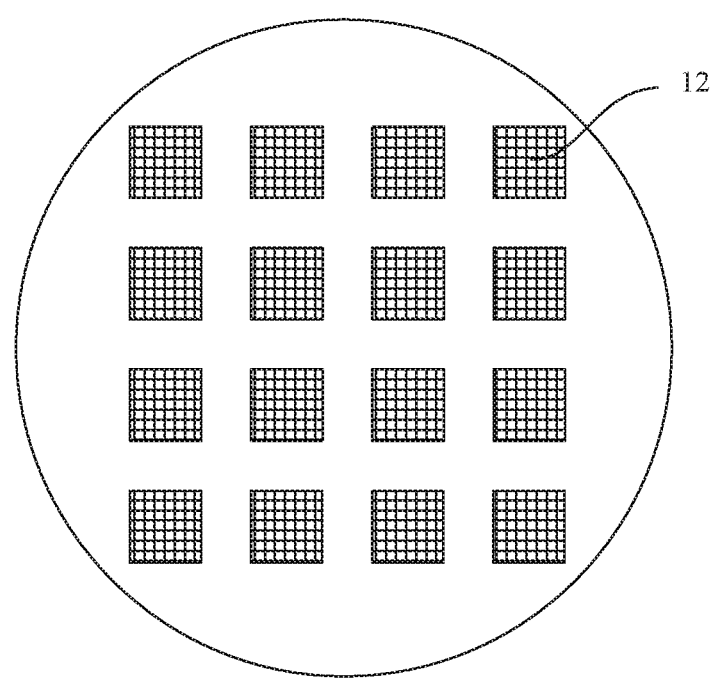
FIG. 3 is a plan view showing a structure of a silicon substrate of a display panel according to some embodiments of the present disclosure.
Figure 4:
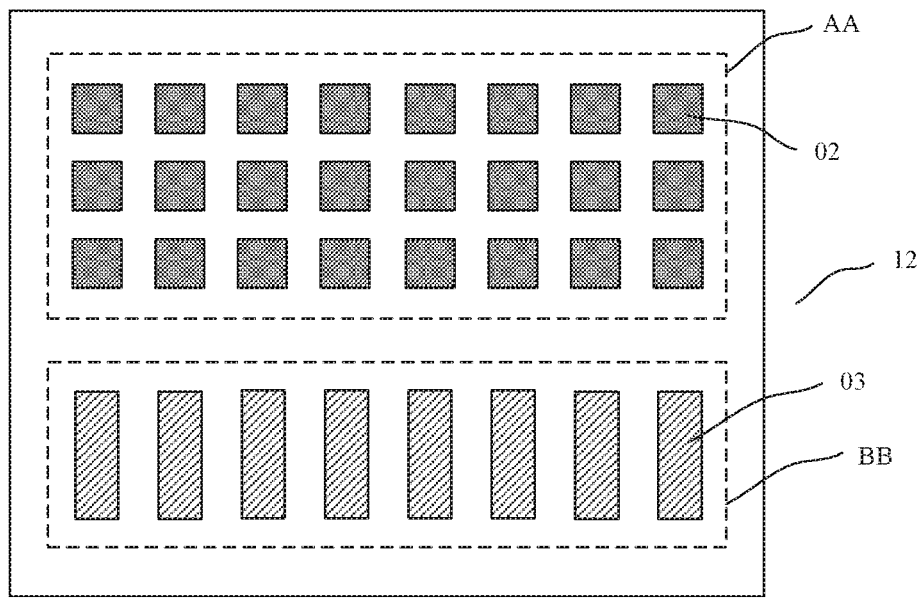
FIG. 4 is a plan view showing a structure of a single display unit on the silicon substrate shown in FIG. 3.

For example, referring to FIGS. 3 and 4, the base material of the base substrate 1 is a silicon substrate. The base substrate 1 further includes a plurality of display units 12 formed on the silicon substrate. Each display unit 12 includes a display area AA and a wiring area (e.g., a pad area) BB.

Herein, the display area AA refers to a region where sub-pixels 02 are provided. A thin film transistor array is provided in the display area AA to form a plurality of pixel driving circuits for driving the sub-pixels 02. A plurality of bonding electrodes 03 and a plurality of signal lines (not shown in FIG. 4) are provided in the pad area BB. The plurality of signal lines are configured to be electrically connected to a plurality of sub-pixels 02 in the display area AA and further electrically connected to the plurality of bonding electrodes 03. The plurality of bonding electrodes 03 are configured to be electrically connected to peripheral components required by a display panel 100, such as a flexible circuit board. In a case where the plurality of bonding electrodes 03 are electrically connected to the flexible circuit board, external electrical signals are transmitted to the plurality of sub-pixels 02 in the display area AA through the flexible circuit board, the plurality of bonding electrodes 03, and the plurality of signal lines in sequence.

In S102, as shown in FIG. 10, a plurality of anodes 2 are formed above the base substrate 1.

The plurality of anodes 2 may be manufactured by a photoetching process in S102. For example, S102 includes the following processes: forming an anode film above a side of the base substrate 1, and forming a photoresist layer including patterns of the plurality of anodes 2 on the formed anode film; and then using the photoresist layer as a mask to etch the formed anode film, so as to form the plurality of anodes 2.

For example, the plurality of anodes 2 are made of indium tin oxide (ITO), or other metallic oxide conductive materials.

In some embodiments, between S101 and S102, S10 further includes the following steps.

As shown in FIG. 1A, a buffer layer 3 is formed on the base substrate 1. The buffer layer 3 is capable of protecting the base substrate 1 and preventing damage to the base substrate 1 during subsequent processes of forming other film layers.

As shown in FIG. 1B, a plurality of top electrodes 8 are formed on a side of the buffer layer 3 facing away from the base substrate 1. In a case where the base substrate 1 includes a thin film transistor array, each top electrode 8 includes a source and a drain of a single thin film transistor. For example, the plurality of top electrodes 8 are made of chromium, silver, or other metal materials.

As shown in FIG. 1C, a second insulating layer 4 is formed on a side of the plurality of top electrodes 8 facing away from the base substrate 1. The second insulating layer 4 is provided with a plurality of via holes 41 for exposing the top electrodes 8.

With continued reference to FIG. 1D, in a case where the plurality of top electrodes 8 and the second insulating layer 4 having the plurality of via holes 41 are formed above the base substrate 1, in a subsequent process of forming the plurality of anodes 2 in S102, it is arranged that the plurality of anodes 2 are in one-to-one correspondence to the plurality of via holes 41, and that each anode 2 is electrically connected, through a corresponding via hole 41, to a source or a drain of a top electrode 8 exposed by the via hole 41. In this way, each top electrode 8 is capable of transmitting an anode voltage VDD to a corresponding anode 2.

With continued reference to FIGS. 1E and 1F, S20 includes step 201 (S201) and step 202 (S202).

In S201, referring to FIG. 1E, a photoresist film 12 is formed on a side of the plurality of anodes 2 facing away from the base substrate 1.

In S202, referring to FIG. 1F, the photoresist film 12 is exposed and developed to form the photoresist layer 5 having a plurality of openings 51.

In some embodiments, each opening 51 is configured to correspond to at least one anode 2. For example, each opening 51 is configured to correspond to one anode 2; or, each opening 51 is configured to correspond to two anodes 2; or, each opening 51 is configured to correspond to three anodes 2, etc.

Figure 6:
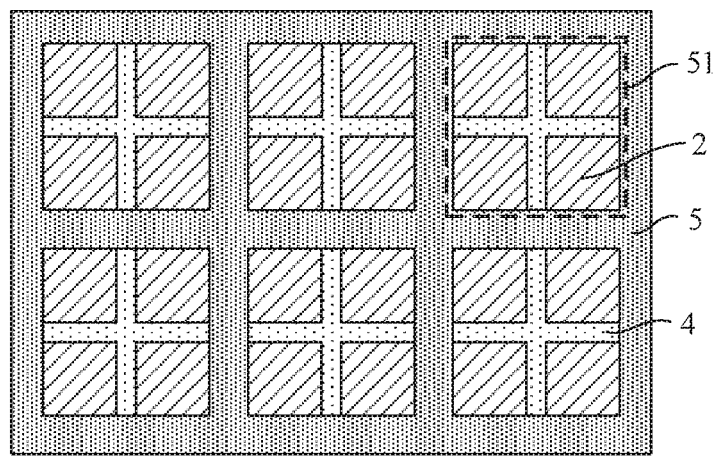
FIG. 6 is a plan view showing a structure of another photoresist layer according to some embodiments of the present disclosure.
Figure 7:
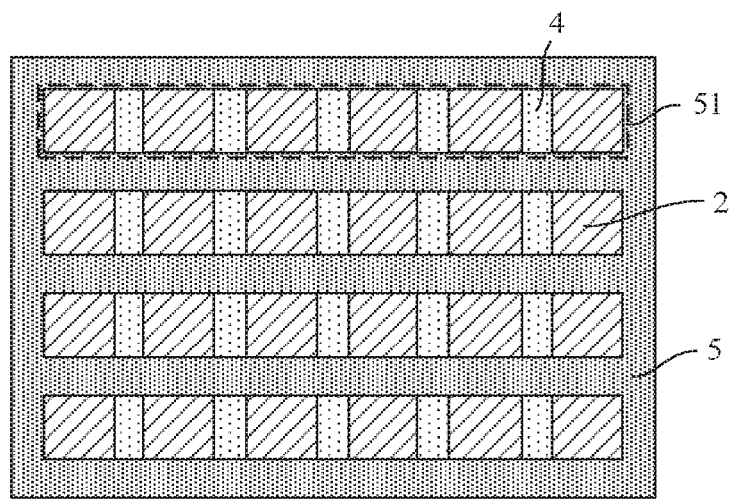
FIG. 7 is a plan view showing a structure of yet another photoresist layer according to some embodiments of the present disclosure.

In addition, a shape of each opening 51 is not limited. For example, referring to FIGS. 5 and 6, an orthographic projection of each opening 51 on the base substrate 1 is in a shape of a block. Or, referring to FIGS. 7, 11 and 15, the orthographic projection of each opening 51 on the base substrate 1 is in a shape of a strip.

For example, as shown in FIG. 5, each opening 51 is in the shape of a block, and each opening 51 is configured to correspond to a single anode 2. An orthographic projection of the photoresist layer 5 on the base substrate 1 is in a shape of a grid. Regions of a plurality of openings of the grid are in one-to-one correspondence to the plurality of openings 51 of the photoresist layer 5. Regions of grid lines of the grid correspond to regions of gaps among the plurality of anodes 2. That is, the regions of the grid lines correspond to the photoresist layer 5 forming the plurality of openings 51.

Figure 8:
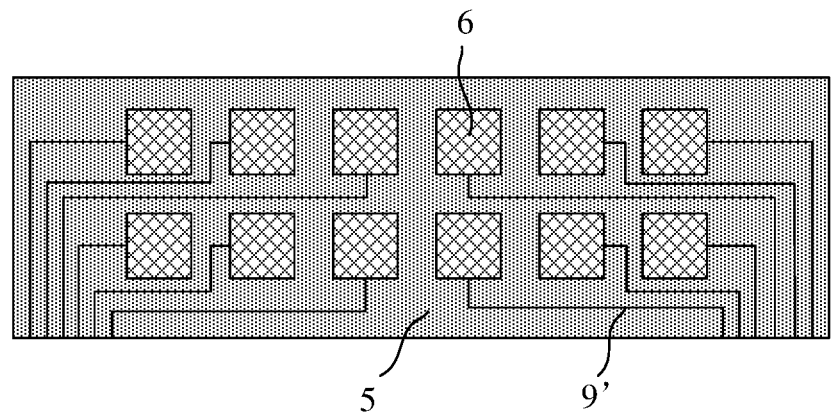
FIG. 8 is a plan view showing a structure of yet another photoresist layer according to some embodiments of the present disclosure.

In some embodiments, referring to FIG. 8, the photoresist layer 5 further has hollow patterns 9' corresponding to a plurality of cathode voltage signal lines 9. In this case, S202 further includes the following process.

As shown in FIG. 8, the hollow patterns 9' corresponding to the plurality of cathode voltage signal lines 9 are formed in the photoresist layer 5. Herein, the plurality of cathode voltage signal lines 9 are formed above the base substrate 1 in a subsequent process through the hollow patterns 9'.

For example, the plurality of openings 51 and the hollow patterns 9' corresponding to the cathode voltage signal lines are formed by a same exposure and a same development process, thereby simplifying process steps thereof.

Referring to FIGS. 1G and 1H, S30 includes step 301 (S301) and step 302 (S302).

In S301, referring to FIG. 1G, a plurality of light emitting layers 6 are formed above a side of the base substrate 1 above which the plurality of anodes 2 and the photoresist layer 5 are provided.

For example, with a display panel including sub-pixels of three colors—red (R), green (G) and blue (B)—as an example, a fine metal mask (FMM) is used in the process of forming the light emitting layers 6 in S301, so as to evaporate light emitting materials capable of emitting light of three colors of R, G and B, and form light emitting layers 6 of sub-pixels of three colors of R, G and B arranged according to a certain rule on the plurality of anodes 2.

It will be noted that, in the process of forming the plurality of light emitting layers 6 in S301, a situation in which a small amount of light emitting material is deposited on the photoresist layer 5 may occur.

In S302, as shown in FIG. 1H, the cathode layer 7 is formed on a side of the plurality of light emitting layers 6 facing away from the base substrate 1 and a side of the photoresist layer 5 facing away from the base substrate 1. The cathode layer 7 includes a plurality of cathode films 71, and each cathode film 71 corresponds to a single opening 51.

For example, S302 includes the following process.

A process such as a PECVD (Plasma Enhanced Chemical Vapor Deposition) process is adopted to deposit a cathode layer material on the side of the plurality of light emitting layers 6 facing away from the base substrate 1 and the side of the photoresist layer 5 facing away from the base substrate 1. During the deposition process, part of the cathode layer material falls onto the plurality of light emitting layers 6 to form the plurality of cathode films 71. In this process, the photoresist layer 5 having the plurality of openings 51 divides the cathode layer 7 into the plurality of independent cathode films 71, and a shape of each cathode film 71 is the same or approximatively the same as a shape of a corresponding opening 51.

In addition, part of the cathode layer material falls onto the surface of the photoresist layer 5 facing away from the base substrate to form the part 72 of the cathode layer 7 other than the plurality of cathode films. In some embodiments, the part 72 of the cathode layer 7 other than the plurality of cathode films is removed in a subsequent process, so as to ensure that the cathode films 71 are independent of each other.

Figure 9:
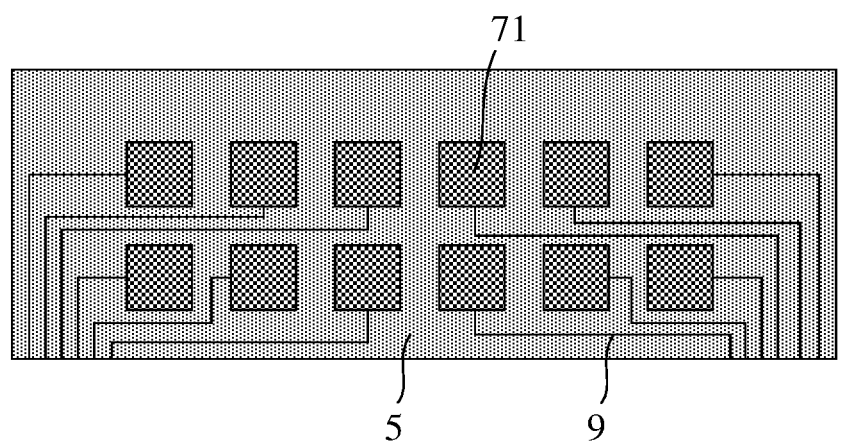
FIG. 9 is a plan view showing a structure of a cathode layer of a display panel according to some embodiments of the present disclosure.

In some embodiments, as shown in FIG. 8, in a case where the photoresist layer 5 formed in S20 includes the plurality of openings 51 and the hollow patterns 9' corresponding to a plurality of cathode voltage signal lines 9, as shown in FIG. 9, S302 further includes a process of forming the plurality of cathode voltage signal lines 9. In this process, the cathode layer material is deposited above a portion of a surface of the base substrate 1 exposed by the hollow patterns 9' (i.e., deposited into the hollow patterns 9'), so as to form the plurality of cathode voltage signal lines 9. Each cathode voltage signal line 9 is electrically connected to at least one cathode film 71, and is configured to transmit a cathode voltage VSS to corresponding cathode film(s) 71.

Herein, the plurality of cathode films 71 and the plurality of cathode voltage signal lines 9 may be formed by a single process. That is, the cathode layer 7 formed in S302 includes both the plurality of cathode films 71 and the plurality of cathode voltage signal lines 9. In this way, a process of separately forming the cathode voltage signal lines 9 may be omitted, and process steps may be simplified. In addition, since the formed plurality of cathode voltage signal lines 9 are in a same layer as and are directly electrically connected to the corresponding cathode film(s) 71, film layers in the display panel may be simplified.

Referring to FIG. 1I, in S40, the part 72 of the cathode layer 7 other than the plurality of cathode films and the photoresist layer 5 are removed. In this way, it may be possible to prevent the part 72 of the cathode layer 7 other than the plurality of cathode films from connecting two adjacent cathode films 71, and ensure that the cathode films 71 are insulated from each other. Therefore, it may be further ensured that the cathode films 71 are independent of each other.

For example, in S40, a laser ablation process is adopted in removing the part 72 of the cathode layer 7 other than the plurality of cathode films and the photoresist layer 5. During the laser ablation process, the part 72 of the cathode layer 7 other than the plurality of cathode films is fused, and the photoresist layer 5 below the part 72 is exposed and then ashed. In this way, the part 72 of the cathode layer 7 other than the plurality of cathode films and the photoresist layer 5 are removed through laser ablation. Therefore, the cathode films 71 may be completely separated from each other, and it may be further ensured that the cathode films 71 are independent of each other.

In addition, it will be noted that the laser ablation process has a high accuracy up to a micron level. Even if gaps among the cathode films 71 are very small, it may be possible to effectively remove the photoresist layer 5 located in the gaps and the part 72 of the cathode layer 7 other than the plurality of cathode films located in the gaps.

Referring to FIG. 1J, in a case where the part 72 of the cathode layer 7 other than the plurality of cathode films and the photoresist layer 5 have been removed in S40, there will be gaps among adjacent cathode films 71. In S50, the first insulation layer 10 fills gaps among the adjacent cathode films 71, so that the cathode films 71 are insulated from each other. In this way, the sub-pixels are further separated from each other, and it may be further ensured that the cathode films 71 are independent of each other. In this case, the first insulating layer 10 is capable of blocking external water and oxygen, thereby protecting film layers in each sub-pixel. For example, the first insulating layer 10 is made of an organic material.

Referring to FIG. 1K, in S60, a cover plate 11 is provided on a side of the first insulating layer 10 facing away from the base substrate 1. The cover plate 11 is capable of isolating an internal structure of the display panel from the outside, thereby protecting the display panel. For example, the cover plate 11 in S60 is a glass substrate, a PI (polyimide) substrate, a PET (polyethylene terephthalate) substrate, or the like.

It will be noted that, each opening 51 shown in FIGS. 1A to 1K is configured to correspond to a single sub-pixel. That is, each opening 51 is configured to correspond to a single anode 2, a single light emitting layer 6, and a single cathode film 71. In this case, since each two of the anode 2, the opening 51, the light emitting layer 6, and the cathode film 71 are in one-to-one correspondence to each other, it may be achieved that each cathode film 71 corresponds to a single sub-pixel. Therefore, an independence of each sub-pixel may be improved. In a case where a certain sub-pixel is short-circuited, the short-circuited sub-pixel may only affect the corresponding cathode film 71, and may not affect other cathode films 71 that do not correspond to the short-circuited sub-pixel. Therefore, cathode voltages VSS of other sub-pixels may not be affected.

In some embodiments, referring to FIGS. 10 to 13 and FIGS. 14 to 17, each opening 51 is configured to correspond to at least two anodes 2, at least two light emitting layers 6, and a single cathode film 71. That is, each opening 51 corresponds to at least two sub-pixels. In this case, a certain short-circuited sub-pixel corresponding to an opening 51 may only affect sub-pixel(s) corresponding to the same opening 51 through the cathode film 71 corresponding to the short-circuited sub-pixel, and may not affect sub-pixels corresponding to other openings 51. As a result, the influence range of the short-circuited sub-pixel may be reduced, and the reliability and display effect of the display panel may be improved.

Figure 12:
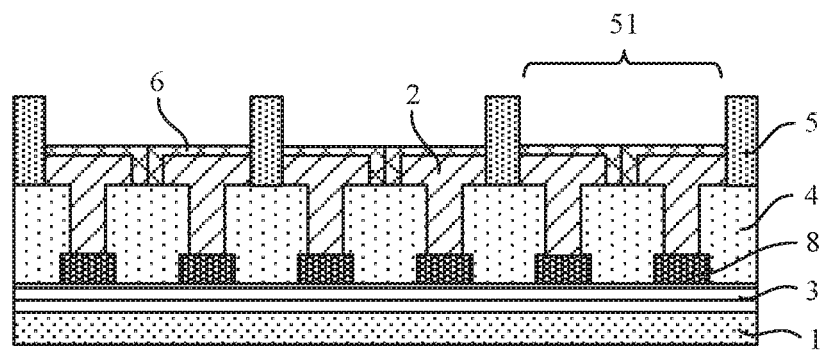
FIG. 12 is a schematic diagram showing another step of a method of manufacturing a display panel according to some embodiments of the present disclosure.

For example, in a case where each opening 51 corresponds to at least two anodes 2, referring to FIG. 12, during a process of forming the light emitting layers 6 in S30, in each opening 51, it is arranged that area(s) of the light emitting layer(s) 6 corresponding to at least one anode 2 is respectively greater than area(s) of the at least one anode 2. In this way, the light emitting material(s) of the at least one light emitting layer(s) 6 corresponding to the at least one anode 2 may fill the gap(s) between the at least one anode 2 and anode(s) 2 adjacent thereto.

Based on this, in some embodiments, the step of forming the plurality of light emitting layers 6 includes: using light emitting materials emitting light of different colors to form light emitting layers 6 emitting light of corresponding colors sequentially. During a process of forming light emitting layers 6 emitting light of each color, in each opening 51, an area of each light emitting layer 6 is set to be greater than an area of an anode 2 corresponding to the light emitting layer 6, so that the light emitting material of the light emitting layer 6 fills gap(s) between the at least two anodes 2 corresponding to the opening 51.

In this way, it may be possible to use the light emitting material to isolate the cathode film 71 and the anodes 2 corresponding to a same opening 51, so as to prevent the cathode layer material from falling into gap(s) between the at least two anodes 2 in each opening 51 during the deposition process. If the cathode layer material falls into the gap(s), the cathode film 71 may be electrically connected to the anodes 2 and a short circuit of corresponding sub-pixels may result.

It will be noted that, since gap(s) between the at least two anodes 2 corresponding to each opening 51 are very small, the area of the light emitting layer 6 only needs to be set to be slightly greater than the area of the corresponding anode 2 to make the light emitting material fill the gap(s) between the at least two anodes 2 corresponding to each opening 51.

Figure 11:
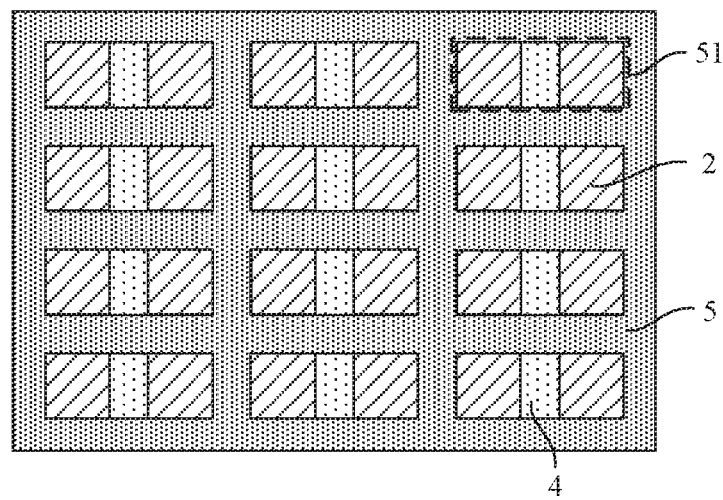
FIG. 11 is a top view corresponding to FIG. 10.
Figure 13:
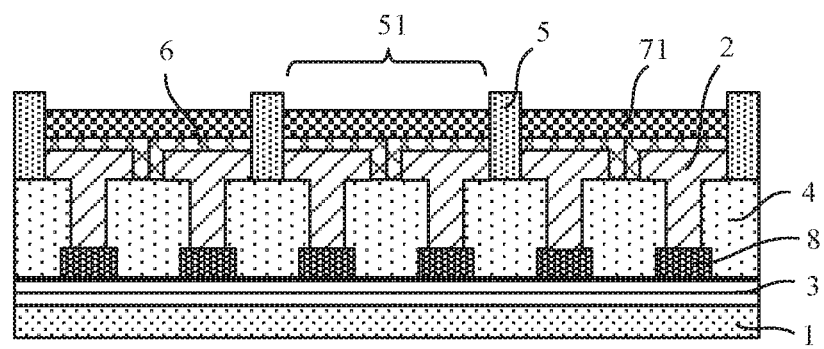
FIG. 13 is a schematic diagram showing yet another step of a method of manufacturing a display panel according to some embodiments of the present disclosure.

For example, as shown in FIGS. 10 to 13, each opening 51 corresponds to two anodes 2, two light emitting layers 6, and a cathode film 71. That is, each opening 51 corresponds to two sub-pixels. During the process of forming the photoresist layer 5 in S20, it is arranged that each opening 51 in the photoresist layer 5 corresponds to two anodes 2, as shown in FIGS. 10 and 11. During the process of forming the light emitting layers 6 in S30, light emitting materials emitting light of different colors are used to form the light emitting layers 6 emitting light of corresponding colors sequentially. During a process of forming light emitting layers 6 emitting light of each color, the area of each light emitting layer 6 is set to be slightly greater than the area of the corresponding anode 2, so that the light emitting material fills the gap between the two anodes 2 in each opening 51, as shown in FIG. 12, During the process of forming the cathode layer 7 in S30, it is arranged that each opening 51 corresponds to a single cathode film 71, and the cathode film 71 corresponds to two anodes 2 and two light emitting layers 6, as shown in FIG. 13. In this way, in the case where a certain sub-pixel is short-circuited, the short-circuited sub-pixel may only affect a cathode voltage VSS of the other sub-pixel corresponding to the same opening 51, and may not affect sub-pixels corresponding to other openings 51. Therefore, the influence range of the short-circuited sub-pixel may be reduced, and the display effect and reliability of the display panel may be improved.

Figure 14:
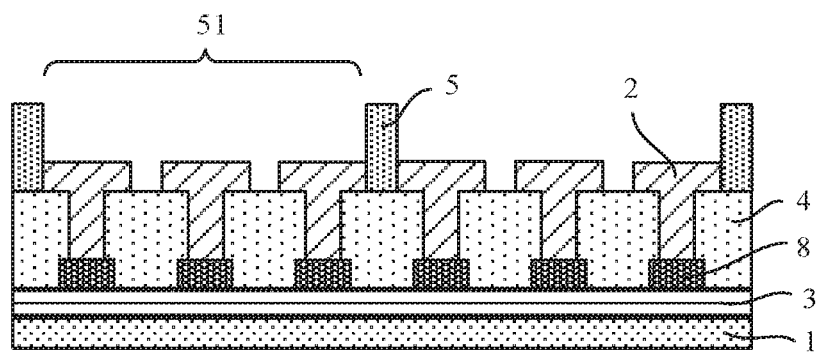
FIG. 14 is a schematic diagram showing one step of another method of manufacturing a display panel according to some embodiments of the present disclosure.
Figure 15:
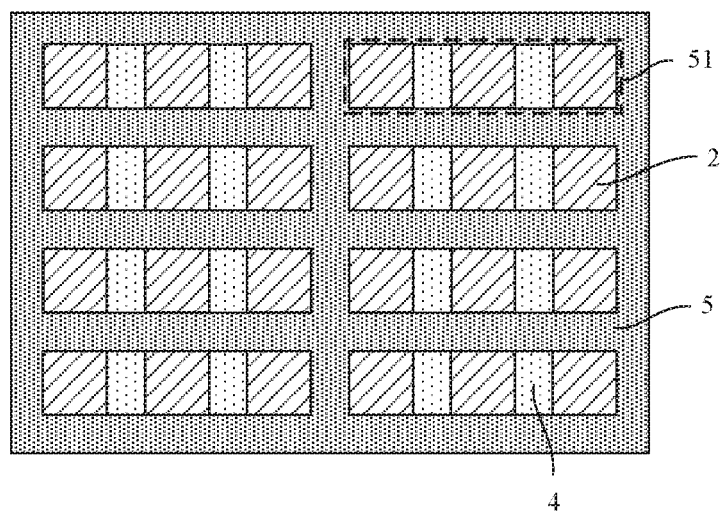
FIG. 15 is a top view corresponding to FIG. 14.
Figure 16:
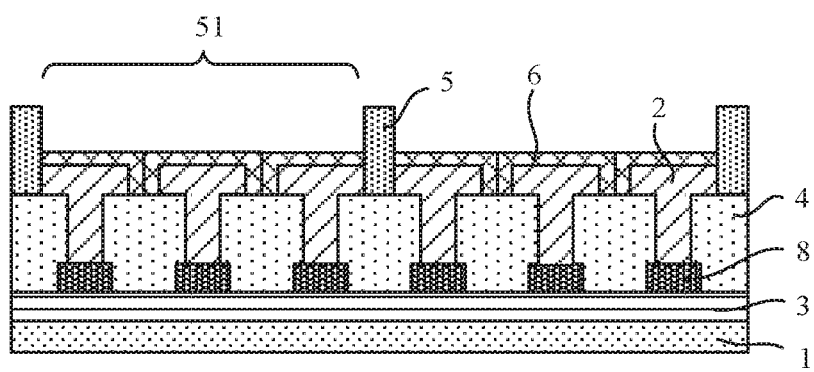
FIG. 16 is a schematic diagram showing another step of another method of manufacturing a display panel according to some embodiments of the present disclosure.
Figure 17:
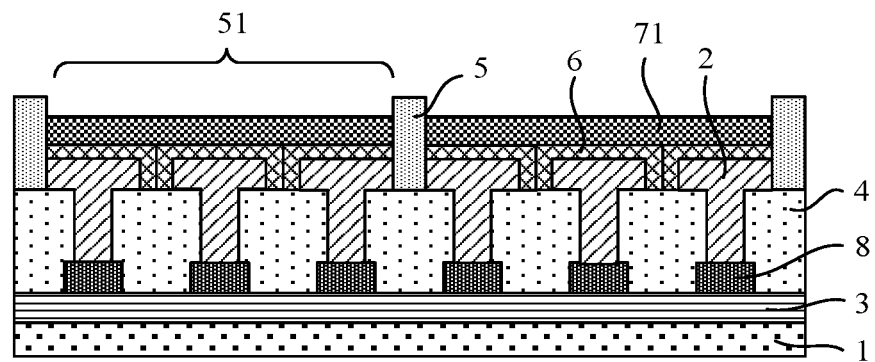
FIG. 17 is a schematic diagram showing yet another step of another method of manufacturing a display panel according to some embodiments of the present disclosure.

For example, as shown in FIGS. 14 to 17, each opening 51 corresponds to three anodes 2, three light emitting layers 6, and a single cathode film 71. That is, each opening 51 corresponds to three sub-pixels. During the process of forming the photoresist layer 5 in S20, it is arranged that each opening 51 in the formed photoresist layer 5 corresponds to three anodes 2, as shown in FIGS. 14 and 15. During the process of forming the light emitting layers 6 in S30, light emitting materials emitting light of different colors are used to form the light emitting layers 6 emitting light of corresponding colors sequentially. During the process of forming light emitting layers 6 emitting light of each color, the area of each light emitting layer 6 is set to be slightly greater than the area of the corresponding anode 2, so that corresponding light emitting material fill gaps among the three anodes 2 corresponding to each opening 51, as shown in FIG. 16. During the process of forming the cathode layer in S40, it is arranged that each opening 51 corresponds to a single cathode film 71, and the cathode film 71 corresponds to three anodes 2 and three light emitting layers 6, as shown in FIG. 17.

Figure 18:
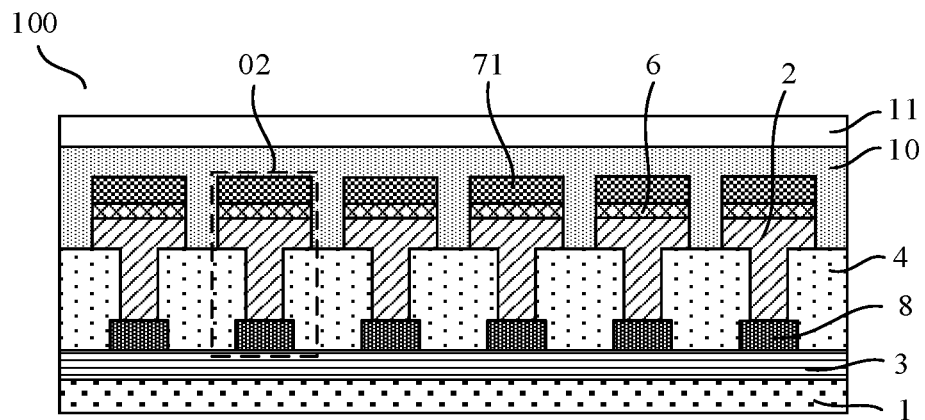
FIG. 18 is a cross-sectional view showing a structure of a display panel according to some embodiments of the present disclosure.

Some embodiments of the present disclosure provide a display panel 100. As shown in FIGS. 18 to 20, the display panel 100 includes: a base substrate 1; a plurality of anodes 2 disposed above the base substrate 1; a plurality of light emitting layers 6 disposed on a side of the plurality of anodes 2 facing away from the base substrate 1, each light emitting layer 6 corresponding to a single anode 2; and a plurality of cathode films 71 disposed on a side of the plurality of light emitting layers 6 facing away from the base substrate 1, the plurality of cathode films 71 being insulated from each other, and each cathode film 71 corresponding to at least one light emitting layer 6.

In this way, each cathode film 71 in the display panel 100 corresponds to at least one sub-pixel 02, and the cathode films 71 are insulated from each other, Therefore, in the case where a short circuit occurs in a certain sub-pixel 02, the short-circuited sub-pixel 02 may not affect cathode films 71 that do not correspond to the short-circuited sub-pixel 02. As a result, the influence range of a certain short-circuited sub-pixel 02 may be reduced, and the reliability of the display panel may be improved.

In addition, in the display panel 100, a cathode voltage VSS provided by a corresponding cathode film 71 may be changed according to different brightness requirements of sub-pixels 02 in different regions, so as to adjust a voltage difference between two ends of a light emitting device D of a sub-pixel 02 in each region and thus make the sub-pixel 02 reach different brightness levels. Compared with a solution in which a one-piece cathode layer can only provide a single voltage, the display panel 100 in the embodiments of the present disclosure may be able to achieve more flexible adjustment and a wider adjustment range for the voltage difference. Therefore, the display effect of the display panel 100 may be further improved.

The number of sub-pixels 02 corresponding to each cathode film 71 is not limited.

For example, referring to FIG. 18, each cathode film 71 corresponds to a single light emitting layer 6 and a single anode 2. That is, each cathode film 71 corresponds to a single sub-pixel 02.

Figure 19A:
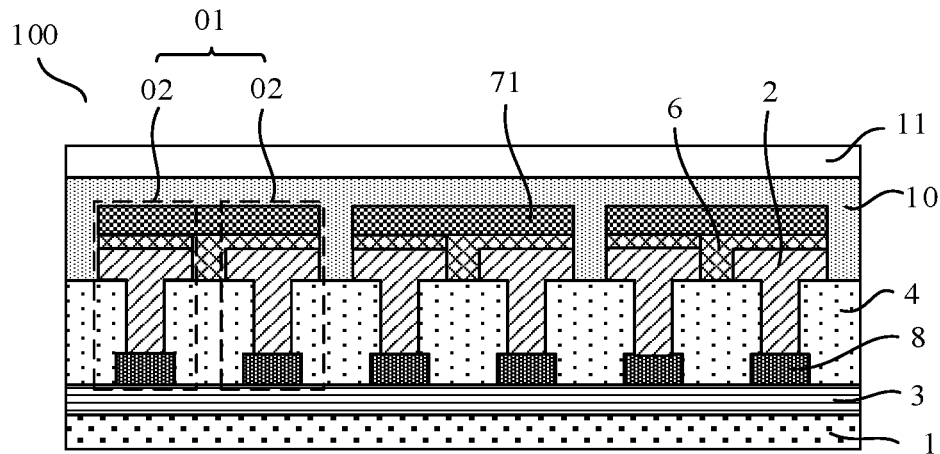
FIG. 19A is a cross-sectional view showing a structure of another display panel according to some embodiments of the present disclosure.
Figure 19B:
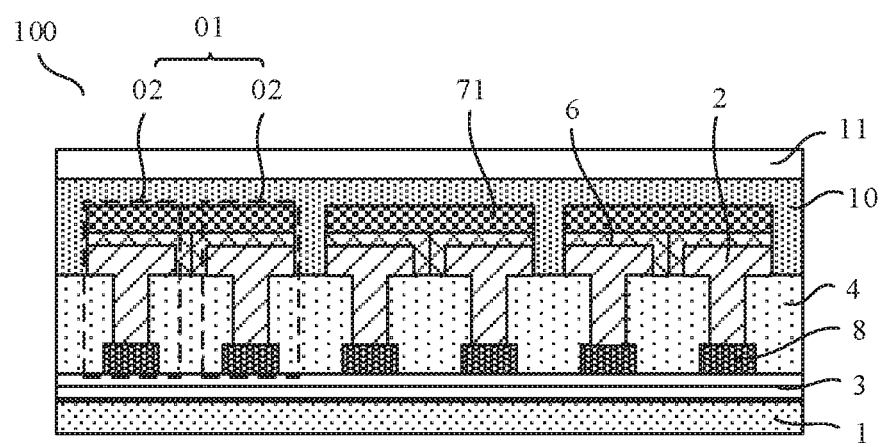
FIG. 19B is a cross-sectional view showing a structure of yet another display panel according to some embodiments of the present disclosure.
Figure 20:
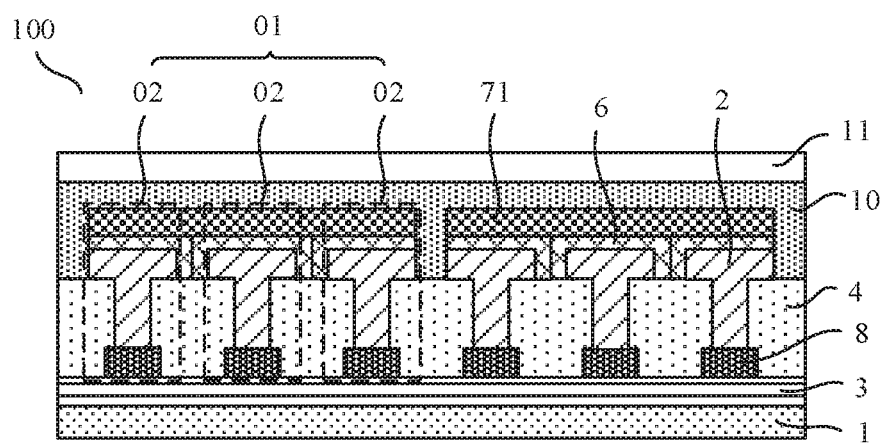
FIG. 20 is a cross-sectional view showing a structure of yet another display panel according to some embodiments of the present disclosure.

In other examples, referring to FIGS. 19A, 19B and 20, each cathode film 71 corresponds to at least two light emitting layers 6 and at least two anodes 2. That is, each cathode film 71 corresponds to at least two sub-pixels 02. For example, referring to FIGS. 19A and 19B, each cathode film 71 corresponds to two light emitting layers 6 and two anodes 2. That is, each cathode film 71 corresponds to two sub-pixels 02. For another example, referring to FIG. 20, each cathode film 71 corresponds to three light emitting layers 6 and three anodes 2. That is, each cathode film 71 corresponds to three sub-pixels 02.

In a case where each cathode film 71 corresponds to at least two sub-pixels 02, for example, gap(s) between the at least two anodes 2 corresponding to each cathode film 71 are filled with light emitting material(s) of at least one of the at least two light emitting layers 6 corresponding to the at least two anodes 2. For example, as shown in FIG. 19A, a gap between two adjacent anodes 2 is filled with a light emitting material of a light emitting layer 6 corresponding to one of the two anodes 2. For another example, as shown in FIG. 19B, a gap between two adjacent anodes 2 is filled with light emitting materials of two light emitting layers 6 corresponding to the two anodes 2.

In this way, gaps between the anodes 2 are filled with light emitting materials. Therefore, the cathode layer material may be prevented from being deposited into the gaps between the anodes 2 during the process of depositing the cathode layer material, and a short circuit caused by the cathode film 71 being connected to corresponding anode(s) 2 may be avoided.

In some embodiments, the display panel 100 has a plurality of sub-pixels 02 arranged in multiple rows or multiple columns, and each sub-pixel 02 includes an anode 2, a light emitting layer 6, and a cathode film 71. A shape of each cathode film 71 in the display panel 100 is not limited.

Figure 21:
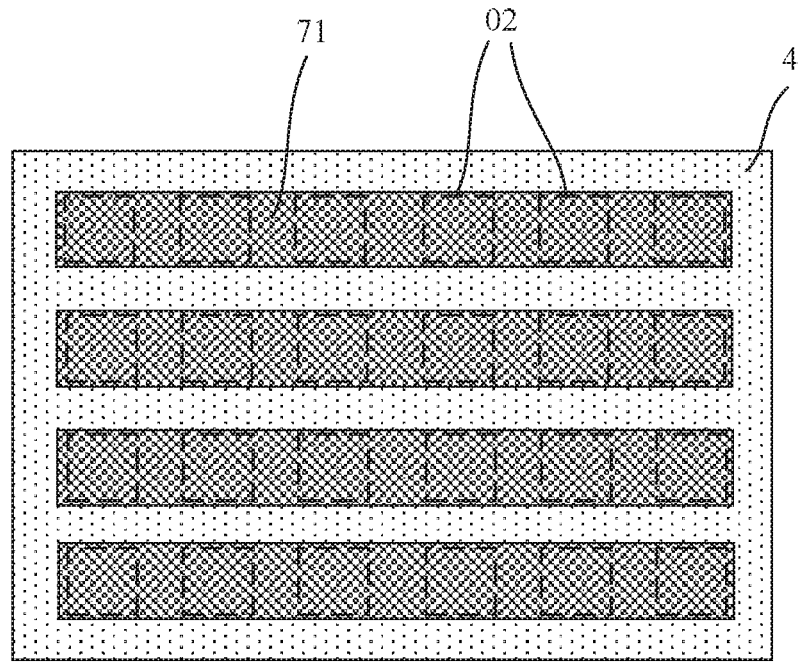
FIG. 21 is a plan view showing a structure of a cathode film according to some embodiments of the present disclosure.

For example, referring to FIG. 21, each cathode film 71 is in a shape of a strip, and an orthographic projection of each cathode film 71 on the base substrate 1 covers orthographic projections of light emitting layers 6 and anodes 2 corresponding to a plurality of sub-pixels arranged consecutively in a single row or a single column of sub-pixels on the base substrate. That is, each cathode film 71 corresponds to a plurality of sub-pixels 02 arranged consecutively in a single row or a single column of sub-pixels, and provides a cathode voltage VSS for the sub-pixels 02.

Figure 22:
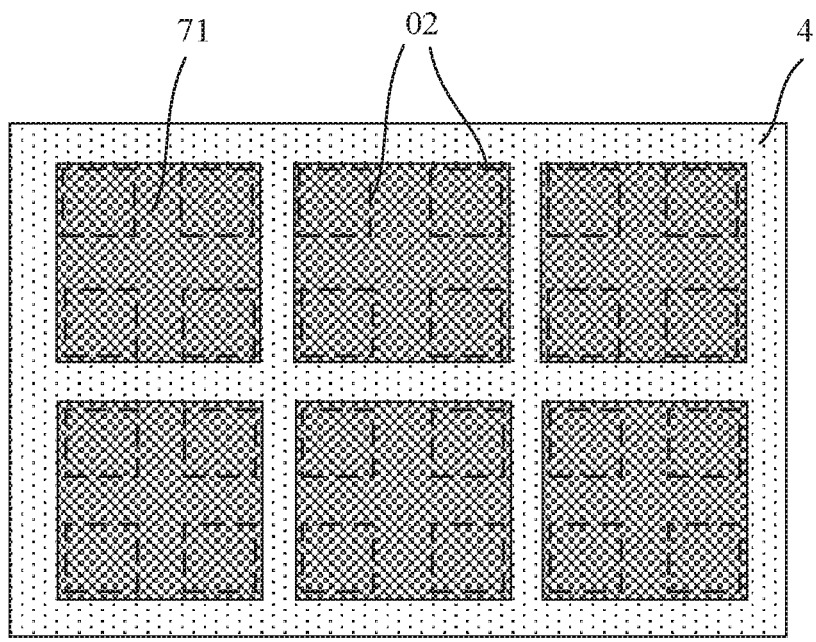
FIG. 22 is a plan view showing a structure of another cathode film according to some embodiments of the present disclosure.

As another example, referring to FIG. 22, each cathode film 71 is in a shape of a block, and the display area of the display panel 100 is divided into multiple polygonal regions. Each polygonal region is provided with a plurality of sub-pixels 02.

The orthographic projection of each cathode film 71 on the base substrate 1 covers orthographic projections of light emitting layers 6 and anodes 2 corresponding to a plurality of sub-pixels 02 in a single polygonal region on the base substrate 1. That is, each cathode film 71 corresponds to a plurality of sub-pixels 02 in a single polygonal region, and provides a cathode voltage VSS for the sub-pixels 02.

In some embodiments, referring to FIGS. 19A, 19B and 20, the display panel 100 has a plurality of pixels 01, and the at least two light emitting layers 6 and at least two anodes 2 corresponding to each cathode film 71 is in a same pixel 01.

For example, as shown in FIGS. 19A and 19B, two light emitting layers 6 and two anodes 2 corresponding to each cathode film 71 correspond to two sub-pixels 02 in a same pixel 01. That is, each cathode film 71 corresponds to two sub-pixels 02 in the same pixel 01. An area of each light emitting layer 6 is greater than an area of a corresponding anode 2, and a gap between two anodes 2 corresponding to a same cathode film 71 is filled with light emitting materials.

As another example, as shown in FIG. 20, three light emitting layers 6 and three anodes 2 corresponding to each cathode film 71 correspond to three sub-pixels 02 in a same pixel 01. That is, each cathode film 71 corresponds to three sub-pixels 02 in the same pixel 01. An area of each light emitting layer 6 is greater than an area of a corresponding anode 2, and gaps among three anodes 2 corresponding to a same cathode film 71 are filled with light emitting materials.

Figure 23:
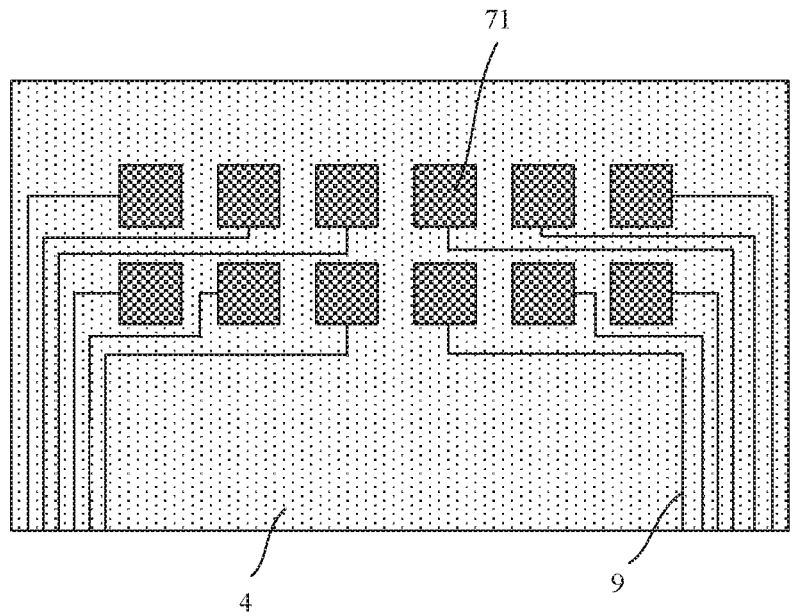
FIG. 23 is a diagram showing an arrangement of cathodes and cathode voltage signal lines in a display panel according to some embodiments of the present disclosure.
Figure 24:
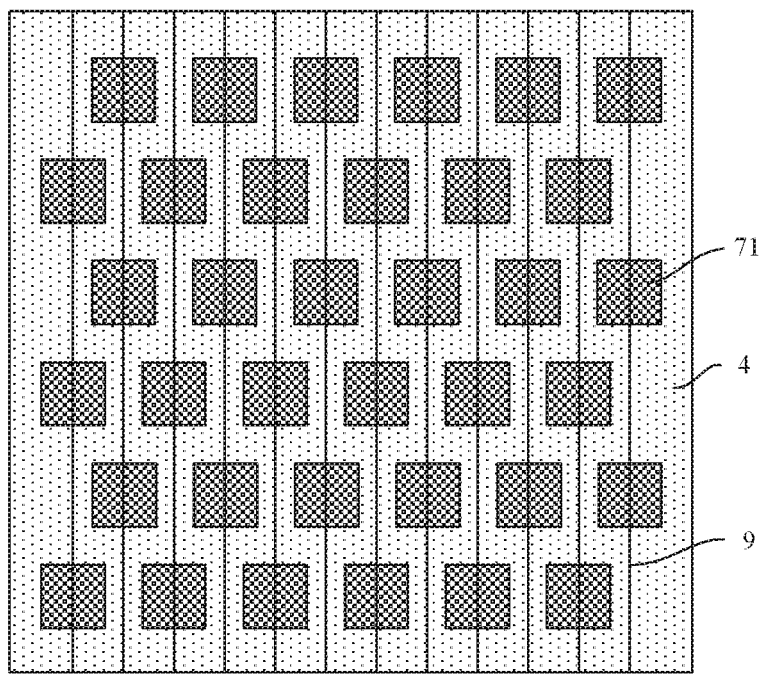
FIG. 24 is a diagram showing an arrangement of cathodes and cathode voltage signal lines in another display panel according to some embodiments of the present disclosure.

In some embodiments, as shown in FIGS. 23 and 24, the display panel 100 further includes a plurality of cathode voltage signal lines 9 that are disposed in a same layer as the plurality of cathode films 71. Each cathode voltage signal line 9 is electrically connected to at least one cathode film 71. In this way, each cathode voltage signal line 9 may be used to transmit a cathode voltage signal to corresponding cathode film(s) 71 that are electrically connected to the cathode voltage signal line 9, so that the cathode films 71 provide cathode voltages VSS for corresponding sub-pixels 02.

For example, as shown in FIG. 23, each cathode voltage signal line 9 is electrically connected to a single cathode film 71. In this way, it may be possible to separately adjust the cathode voltage VSS of each cathode film 71.

In this case, for example, each cathode voltage signal line 9 passes through gaps between cathode films 71, and extends to the pad area of the display panel 100. Moreover, the plurality of cathode films 71 and the plurality of cathode voltage signal lines 9 may be disposed in a same layer. In this way, process steps and film layers of the display panel 100 may be simplified.

It will be noted that, in the related art, PS barrier walls are formed on a glass substrate of a glass-based display panel to achieve division of the cathode layer. However, a process of forming the PS barrier walls requires very strict conditions. For example, an exposure time and an exposure dose need to be strictly controlled. Moreover, due do limitations of a glass-based manufacturing process, a size of blocks the cathode layer is divided into is strictly limited. In addition, a large number of cathode voltage signal lines required to independently control each cathode will inevitably cause an increase in a bezel width of the display panel, which is contrary to the current narrow-bezel trend of display panels.

In some embodiments of the present disclosure, in a case where the base material of the base substrate 1 is a silicon substrate, since a manufacturing accuracy of a silicon substrate exposure machine is extremely high, a distance of lines in the pad area on the silicon substrate may be reduced to a nanometer level. Even if each cathode film 71 is electrically connected to a single cathode voltage signal line 9 and the display panel 100 has a large number of cathode voltage signal lines 9, the bezel width of a display panel 100 including a silicon substrate may not increase. Moreover, this method is not limited by a manufacturing process.

In addition, since the display panel 100 is capable of accommodating a large number of cathode voltage signal lines 9, the size of blocks the cathode layer is divided into in the display panel 100 may not be significantly limited.

For example, as shown in FIG. 24, the plurality of cathode films 71 are arranged in multiple rows or multiple columns, and each cathode voltage signal line 9 is electrically connected to a plurality of cathode films 71 in a single row or a single column. In this way, the cathode voltage VSS of the plurality of cathode films 71 in a single row or a single column may be independently adjusted through each cathode voltage signal line 9.

In this case, for example, each cathode voltage signal line 9 directly passes through cathode films 71 in a corresponding row or column to connect the cathode films 71 in the corresponding row or column in series, and extends to the pad area of the base substrate 1. Moreover, the plurality of cathode films 71 and the plurality of cathode voltage signal lines 9 may be disposed in a same layer to simplify the process steps. In addition, as shown in FIG. 24, the cathode films 71 in each column are connected to a single cathode voltage signal line 9. In this way, the number of lines in the display panel 100 may be reduced, and the manufacturing process may be simplified.

Figure 25:
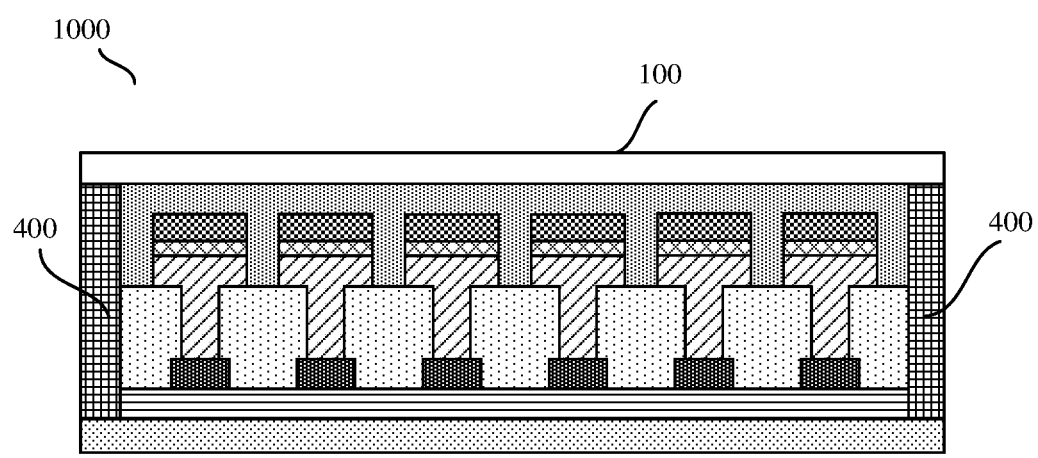
FIG. 25 is a schematic diagram showing a structure of a display device according to some embodiments of the present disclosure.

Some embodiments of the present disclosure provide a display device 1000. Referring to FIG. 25, the display device 1000 includes the display panel 100 described above. Since the display panel 100 may improve reliability and display effect, a display device 1000 including the display panel 100 may also achieve these beneficial effects.

In addition, in some embodiments, the display device 1000 is an OLED display panel, a mobile phone, a tablet computer, a television, a monitor, a laptop computer, a digital photo frame, a navigator, or any product or component having a display function.

For example, as shown in FIG. 25, the display device 1000 further includes a sealant 400.

It will be noted that, in some embodiments, the display panel 100 is a silicon-based display panel. That is, the base material of the base substrate 1 of the display panel 100 is a silicon substrate. The method of manufacturing a display panel provided above is a method of manufacturing a silicon-based display panel. And the display device 1000 provided above is a silicon-based display device including a silicon-based display panel.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A method of manufacturing a display panel, comprising:
   providing a base substrate and forming a plurality of anodes above the base substrate;
   forming a photoresist layer above a side of the base substrate above which the plurality of anodes are formed, the photoresist layer including a plurality of openings and each opening corresponding to at least two anodes; and
   forming a plurality of light emitting layers and a cathode layer sequentially above a side of the base substrate above which the plurality of anodes and the photoresist layer are formed, the cathode layer including a plurality of cathode films and each cathode film corresponding to a single opening; and
   after forming the plurality of light emitting layers and the cathode layer sequentially, removing part of the cathode layer other than the plurality of cathode films and the photoresist layer in a laser ablation process, wherein
   the photoresist layer further includes a plurality of hollow patterns,
   during a process of forming the cathode layer, a cathode layer material is deposited into the plurality of hollow patterns to form a plurality of cathode voltage signal lines corresponding to the plurality of hollow patterns,
   each cathode voltage signal line is electrically connected to a single cathode film,
   each cathode voltage signal line passes through gaps between the plurality of cathode films, and extends to a pad area of the display panel,
   in each opening, each anode is configured to correspond to a single light emitting layer, and
   during a process of forming the plurality of light emitting layers, in each opening, an area of a light emitting layer is set to be greater than an area of an anode corresponding to the light emitting layer, so that a light emitting material of the light emitting layer fills at least one gap between the anode and at least one anode adjacent thereto.

2. The method of manufacturing a display panel according to claim 1, wherein a thickness of the photoresist layer is greater than a sum of a thickness of each anode and a thickness of a light emitting layer corresponding to the anode.

3. The method of manufacturing a display panel according to claim 1, wherein forming the plurality of light emitting layers, includes:
   using light emitting materials configured to emit light of different colors to form light emitting layers configured to emit light of corresponding colors sequentially; and
   during a process of forming light emitting layers configured to emit light of each color, in each opening, an area of each corresponding light emitting layer is set to be greater than an area of an anode corresponding to the light emitting layer, so that the light emitting material of the light emitting layer fills at least one gap between the at least two anodes corresponding to the opening.

4. The method of manufacturing a display panel according to claim 1, wherein an orthographic projection of each opening on the base substrate is in a shape of a strip or a block.

5. The method of manufacturing a display panel according to claim 1, wherein after removing the part of the cathode layer other than the plurality of cathode films and the photoresist layer, the method of manufacturing a display panel further comprises:

forming a first insulating layer above a side of the base substrate above which the plurality of cathode films are formed; and providing a cover plate on a side of the first insulating layer facing away from the base substrate.

6. A display panel manufactured by the method of claim 1, the display panel comprising:

a base substrate;

a plurality of anodes disposed above the base substrate;

a plurality of light emitting layers disposed on a side of the plurality of anodes facing away from the base substrate, each light emitting layer corresponding to a single anode;

a plurality of cathode films disposed on a side of the plurality of light emitting layers facing away from the base substrate, the plurality of cathode films being insulated from each other, and each cathode film corresponding to at least two light emitting layers and at least two anodes; and a plurality of cathode voltage signal lines that are disposed in a same layer as the plurality of cathode films, wherein each cathode voltage signal line is electrically connected to a single cathode film; each cathode voltage signal line passes through gaps between the plurality of cathode films, and extends to a pad area of the display panel, and at least one gap between the at least two anodes corresponding to each cathode film is filled with at least one light emitting material of at least one of the at least two light emitting layers corresponding to the at least two anodes.

7. The display panel according to claim 6, wherein each cathode film is in a shape of a strip or a block.

8. The display panel according to claim 7, further comprising a plurality of sub-pixels arranged in multiple rows or multiple columns, wherein in a case where each cathode film is in the shape of a strip, an orthographic projection of each cathode film on the base substrate covers orthographic projections of light emitting layers and anodes corresponding to a plurality of sub-pixels arranged consecutively in a single row or a single column of sub-pixels on the base substrate; and in a case where each cathode film is in the shape of a block, a display area of the display panel is divided into multiple polygonal regions, each polygonal region is provided with a plurality of sub-pixels; and an orthographic projection of each cathode film on the base substrate covers orthographic projections of light emitting layers and anodes corresponding to a plurality of sub-pixels in a single polygonal region on the base substrate.

9. The display panel according to claim 6, further comprising a plurality of sub-pixels; wherein the at least two light emitting layers and the at least two anodes corresponding to each cathode film are in a same pixel.

10. A display device, comprising the display panel according to claim 6.

11. The method of manufacturing a display panel according to claim 1, wherein the base substrate is a silicon substrate.

12. The method of manufacturing a display panel according to claim 11, wherein a distance of lines in the pad area on the silicon substrate is a nanometer level.

* * * * *